(12) United States Patent
Baertsch et al.

(10) Patent No.: US 8,361,290 B2
(45) Date of Patent: Jan. 29, 2013

(54) COATING REMOVAL INSTALLATION AND METHOD OF OPERATING IT

(75) Inventors: Hanspeter Baertsch, Mels (CH); Sven Egger, Plons (CH); Manfred Wurzer, Wittenbach (CH); Torsten Reyher, Malix (CH); Kerstin Lasch, Bludenz (AT); Udo Rauch, Schlins (AT)

(73) Assignee: Oerlikon Trading, AG, Trubbach, Trübbach (CH)

( * ) Notice: Subject to any disclaimer, the term of this patent is extended or adjusted under 35 U.S.C. 154(b) by 912 days.

(21) Appl. No.: 11/522,449

(22) Filed: Sep. 18, 2006

(65) Prior Publication Data

US 2008/0053841 A1    Mar. 6, 2008

(30) Foreign Application Priority Data

Sep. 5, 2006   (CH) ........................ 1414/06

(51) Int. Cl.
C25F 7/00 (2006.01)
(52) U.S. Cl. .................. 204/297.06; 205/640
(58) Field of Classification Search ............. 204/297.06; 205/640
See application file for complete search history.

(56) References Cited

U.S. PATENT DOCUMENTS

| | | | |
|---|---|---|---|
| 2,645,611 A | | 7/1953 | Axtell |
| 4,234,397 A * | | 11/1980 | Torrey ......................... 205/661 |
| 4,297,197 A * | | 10/1981 | Salman .................... 204/297.06 |
| 4,775,454 A * | | 10/1988 | Urquhart et al. .............. 204/201 |
| 6,531,049 B1 * | | 3/2003 | Kariya et al. ................. 205/717 |
| 6,761,772 B2 * | | 7/2004 | Giacri et al. ................. 118/730 |
| 7,588,640 B2 * | | 9/2009 | Esser ............................ 118/500 |
| 2003/0062271 A1 * | | 4/2003 | Kool et al. .................... 205/717 |
| 2005/0056537 A1 * | | 3/2005 | Chen et al. ................. 204/229.4 |
| 2006/0278535 A1 * | | 12/2006 | Fairbourn .................... 205/645 |

FOREIGN PATENT DOCUMENTS

| | | |
|---|---|---|
| EP | 1 050 607 A2 | 11/2000 |
| JP | A 02 166298 | 6/1990 |
| JP | A-10-291129 | 11/1998 |
| SU | (11) 1565923 A1 | 5/1990 |
| WO | WO 90/05389 A | 5/1990 |
| WO | WO 99/54528 A1 | 10/1999 |

OTHER PUBLICATIONS

"Definition: Kupplung (Definition: Coupling)," *Meyers Lexicon Online*, pp. 1-2, XP-002457820.
Feb. 7, 2012 Japanese Office Action issued in Japanese Patent Application No. 2009-525890 (translation only).
Office Action issued in Russian Application No. a 20090312 dated Jul. 20, 2012 (English Translation only).

* cited by examiner

*Primary Examiner* — Nicholas A. Smith
(74) *Attorney, Agent, or Firm* — Oliff & Berridge, PLC

(57) ABSTRACT

A coupling which is rotatable about a vertical axis of rotation and intended for the mounting of a workpiece support which can be loaded, for example, with incorrectly coated or worn workpieces is arranged in a removable holder above a tank filled with an electrolyte. Said workpiece support is connected via the coupling to a current supply device, to the opposite pole of which an opposite electrode is connected. A heating and cooling device and an ultrasound generator are also arranged in the tank. By current supply and simultaneous rotation, the coating is removed from the workpiece support and/or from the workpieces. After incorrect coating, the workpieces together with the workpiece support and in certain circumstances with the holder can be taken over directly from a coating installation and, after coating removal, transferred to such a coating installation for recoating.

13 Claims, 1 Drawing Sheet

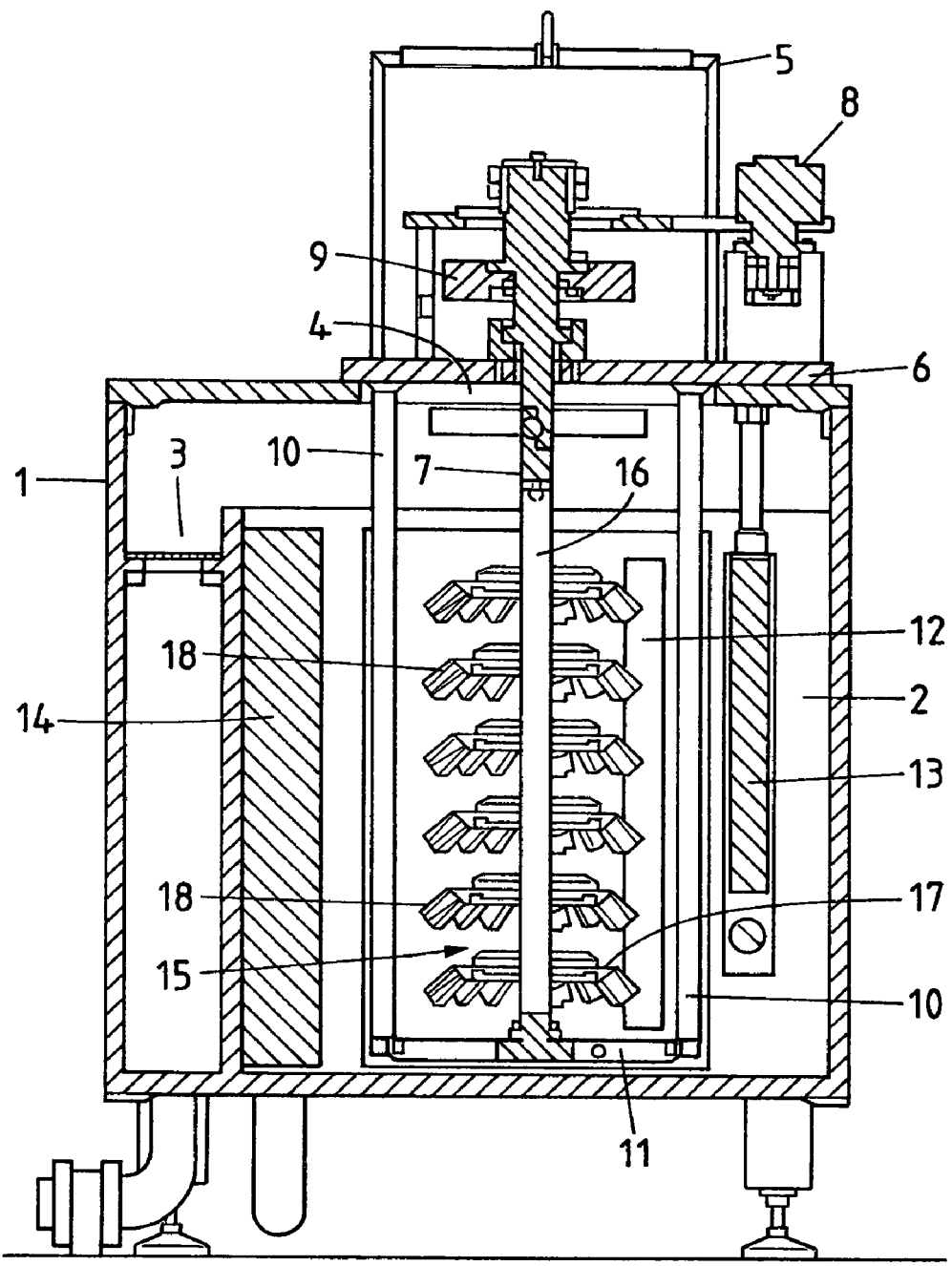

COATING REMOVAL INSTALLATION AND METHOD OF OPERATING IT

FIELD OF THE INVENTION

The invention relates to a coating removal installation and a method of operating it. Coating removal installations are used for freeing workpiece supports which are used in coating installations and are inevitably also coated there from their coating and for making them suitable for use again and also for removing the coating from worn or incorrectly coated workpieces and thus preparing them for recoating.

THE PRIOR ART

Mechanical methods, especially sand blasting, are predominantly used today for removing the coating from workpiece supports. The workpiece supports have to be dismantled for this purpose. After the treatment, the sand has to be carefully removed, for example by blowing away. Nevertheless, frequently residues cannot be avoided, which may subsequently lead to malfunctions. Moreover, the workpiece supports are unevenly worn during the sand blasting and are subject to considerable wear, which shortens their life.

For removing the coating from worn and incorrectly coated workpieces, electrochemical methods are also used, cf. for example, WO 99/54 528 A1. Coating removal installations according to an embodiment are used for this purpose. Some of these installations have baskets or rotating drums which can be moved up and down for receiving the workpieces.

In general, however, the workpieces have to be individually contacted. This is particularly complicated in the removal of layers of non-conductive material where the contacting is subject to further limitations and the workpieces have to be mounted individually on holders.

The formation and positioning of the opposite electrode surface in known coating removal installations of the generic type are difficult and cannot always be optimally realised, since the current flow should be distributed as uniformly as possible over those surface regions of the workpieces from which the coating is to be removed, so that uniform coating removal is achieved and corrosion of the body bearing the coating is avoided.

SUMMARY OF THE INVENTION

It is the object of the invention further to develop coating removal installations of the generic type so that the process of coating removal is substantially simplified and can be carried out with great reliability. This object is achieved by the features in an embodiment. In addition, methods for operating a coating removal installation according to the invention are described, by means of which coating removal and also, in addition to the coating removal, more complex processes comprising further steps can be carried out in a simple manner.

Advantages of the invention are in particular that removing the coating from workpiece supports can be effected substantially more easily and more gently. Since mechanical processing can be substantially avoided, the life is substantially longer. After treatment is necessary at most to a small extent (washing, spraying, drying) and requires scarcely any manual work. In addition, however, removing the coating from worn and incorrectly coated workpieces is also substantially simplified and can be effected far more reliably. By turning the workpiece support, a more or less uniform current density—averaged over the processing time—can be achieved more easily. Particularly in the case of workpieces having a non-conductive coating, the handling is generally substantially simplified since the workpieces are contacted in exactly the same way during the coating removal as in the case of the coating.

Particularly if incorrectly coated workpieces are to be removed of the coating and recoated, the handling effort can be substantially reduced if the workpieces are processed by means according to the invention. For coating removal, they remain in this case on the workpiece support on which they were originally coated. Removal and remounting are dispensed with since the workpiece support with the mounted and contacted workpieces is transferred from a coating installation to the coating removal installation according to the invention and inserted therein. In the case of recoating of the workpieces, the workpiece support with the workpieces is transferred in the same way after coating removal to a coating installation and inserted therein, whereupon the workpieces are recoated. Direct handling of the workpieces can be dispensed with.

BRIEF DESCRIPTION OF THE DRAWINGS

Below, the invention is explained in more detail with reference to a FIGURE which shows only an embodiment.

FIG. 1 shows a vertical section through a coating removal installation according to the invention.

DESCRIPTION OF THE PREFERRED EMBODIMENTS

The coating removal installation according to the invention comprises a cuboid housing 1 which contains a tank 2 which consists of non-conductive material or is coated on the inside with a non-conductive material so that the inner surface is non-conductive. It serves for holding a liquid electrolyte. An overflow 3 with a screen or a filter is arranged next to the tank 2. At the top, the housing 1 has an opening 4.

A holder 5 comprises a baseplate 6 by means of which it is supported on the housing 1 and a coupling 7 which is rotatably mounted in the baseplate 6. Its axis of rotation runs vertically and approximately centrally through the tank 2. A drive device 8 which is in the form of an electric motor has an operative connection to the coupling 7. The holder 5 likewise comprises a two-pole current supply device (not shown), one pole of which has an electrically conductive connection via a current transmission device 9 to the coupling 7. It may be in the form of a current source, a voltage source, pulsed current source or pulsed voltage source or in the form of an alternating current supply. The holder 5 is connected to the housing 1 so that it can be removed without great effort, for example simply lifted off. The current supply device may also be external so that the coating removal installation has only connections for connection to said current supply device, one connection of which is connected to the current transmission device 9. Moreover, a frame surrounding the axis of rotation is provided with a plurality of parallel rods 10 which are anchored to the baseplate 6 and on the ends of which a cross-strut 11 is held. The other pole of the current supply device or the other connection is connected to an opposite electrode 12 which, for example, is in the form of a grid electrode and is arranged in the interior of the tank 2. The opposite electrode 12 has an opposite electrode surface facing the axis of rotation, approximately equidistant from said axis everywhere and extending substantially over the entire height of the tank 2. Said opposite electrode surface may have, for example, the form of a concave cylinder lateral surface, the axis of which coincides with the axis of rotation and which extends over a smaller or larger sector of, for example, 90° to 180°. However, the opposite electrode may also be in the form of a rod electrode. A heating and cooling device 13 and an ultrasound generator 14 and an inlet for the electrolyte and devices for moving said electrolyte, such as pumps or stirrers (not shown), are also arranged in the tank 2.

During operation, the tank 2 is filled up to at least close to the upper edge with a liquid electrolyte. A workpiece support 15 which is in the form of a rotation-symmetric multilevel support with a central support shaft (in the following called support tree) in the example, in particular a central shaft 16 of said workpiece support which lies in the axis of rotation, is non-rotatably connected to the coupling 7, to which shaft discs 17 are fastened in succession at regular intervals, which discs carry workpieces 18 distributed in each case over their periphery. There are various possibilities for the formation of the connection between the coupling 7 and the shaft 16. Rapidly producible and detachable connections, such as plug connections or bayonet connections, are preferred. The tip of the shaft 16 is rotatably mounted on the cross-strut 11. The shaft 16 is connected to the first pole of the current supply device via the coupling 7 and the discs 17 too are connected via the shaft. The workpieces 18 are fastened to the discs 17 and contacted so that they too have an electrically conductive connection to the first pole of the current supply device. The workpiece support 15 as well as all other components of the coating removal installation which are arranged in the tank 2 must consist of a material which is not attacked by the electrolyte, usually of stainless steel or, where this is not possible, as in the case of some magnetic materials, must be encapsulated in stainless foil.

The workpiece support may also be formed other than as described; in principle, it is possible to use any type of workpiece support which is rotatable about an axis of rotation and is used in coating installations, in particular vacuum coating installations, for example support trees with multiple rotation, it being possible for driver fingers or workpiece supports of another type having magnetic or plug plates to be mounted, for example, on the rods 10. The fastening of the workpieces can be effected in the manner customary in vacuum coating installations, for example by plug or clamp connections or magnetically.

The current supply device now produces an intermittent or permanent potential difference between the workpiece support 15 acting as electrode and the workpieces 18 contacted via said workpiece support on the one hand and the opposite electrode 12 on the other hand. Where applicable, the electrode is usually connected as the anode and the opposite electrode is the cathode. At the same time, the coupling 7 is rotated uniformly by the drive device 8, and with it the workpiece support 15, the rotational speed being adapted to the process. The workpieces 18 are moved closely past the opposite electrode surface, preferably at a minimum distance of between 2 cm and 20 cm, preferably between 3 cm and 8 cm. The coating removal is now effected as a rule by electrochemical dissolution of the coating of both the workpiece support 15 and the workpieces 18. Owing to the rotation of the workpiece support 15, the current density is fairly uniform on average as a function of time, i.e. the current is uniformly distributed over the surfaces from which the coating is to be removed and the coating removal is accordingly effected uniformly and in a gentle manner. This is also assisted by the fact that, in any case according to a preferred development, all parts of the opposite electrode surface are about the same distance away from the axis of rotation and hence from the shaft 16.

It is also possible for the coating to consist of an adhesive layer deposited directly on the body and a functional layer deposited on said adhesive layer and for the coating removal to be effected by dissolution of the adhesive layer through pores of the functional layer, as described, for example in WO 99/64 646 A1 and WO 05/073 433 A1. Especially in such cases, the coating removal process can be substantially accelerated and improved by the use of the ultrasound generator 14.

Various modes of operation are possible with the coating removal installation according to the invention. Thus, it can be used, for example, for removing the coating from a workpiece support 15 alone, i.e. a workpiece support without workpieces. Alternatively it can be used for removing the coating from workpieces incorrectly coated beforehand in a coating installation, in particular a vacuum coating installation. In this case, for example, the holder 5 together with the workpiece support 15 and workpieces 18 can be removed from the coating installation and inserted into the coating removal installation without it being necessary to carry out any other manipulations on these parts.

The same procedure can be adopted in the case of recoating after coating removal is complete. In this case, the holder 5 together with the workpiece support 15 and the workpieces 18 can be removed from the housing 1 of the coating removal installation and transferred to a coating installation, in particular a vacuum coating installation, and inserted into the vacuum chamber thereof and, for example, coated by the CVD or PVD process. In a multi-chamber unit, it is also possible, between coating removal and recoating, to carry out other steps in suitable chambers, such as washing, spraying and drying, all without having to separate the workpiece support 15 from the holder 5 or even having to remove the workpieces 18. Of course, coating removal and recoating can also be carried out in this manner in succession after incorrect coating. A suitable transport device can be provided for moving the holder 5 between the chambers. In this way, even complex processes comprising a plurality of processing steps can be substantially automated.

Alternatively, it is possible to move in each case the workpiece support 15 alone, equipped with workpieces 18, in the manner described, it being necessary to mount said workpiece support on the coupling 7 and corresponding couplings in the other chambers or to uncouple it from them. This is somewhat more complex but the requirements which the transport device has to meet may be lower.

Many modifications of the coating removal installation described are also possible. Thus, a plurality of couplings for a plurality of workpiece supports can be provided in the tank. Instead of being arranged above the tank or in its upper region, the coupling can also be arranged on its bottom. The tank can be formed in such a way that other process steps, such as washing, spraying and drying, can also be carried out in it. For this purpose, pumps and a collecting volume for temporary removal of the electrolyte can be provided.

Some examples for possible developments of coating removal installations according to the invention and methods in which they are used are given below:

1. Holders for plungers of piston valves which became coated with a multi-layer coating up to 100 μm thick after repeated use in coating processes for depositing DLC and CrN/DLC coatings were loaded, on support trees, on a plurality of rotatable couplings mounted in the bottom of a tank. The individual support trees were each fastened to a coupling electrically conductive in the contact region, the drivers were positioned against the satellites in a manner similar to that in PVD installations and the tank was then filled with a potassium hydroxide-containing electrolyte to which phosphates and surfactants had been added and which had a pH of between 11 and 13. With constant revolution, the tree with double-rotating satellites was removed at room temperature and a constant +12 V voltage in the course of 1 h. The electrolyte attack took place in each case through the pores of the DLC layer to the CrN layer or the thin Cr layer deposited under the DLC as an adhesive layer.

2. From trees with double-rotating satellites for bucket tappets which became coated after repeated use with DLC and CrN/DLC layers the latter were removed similarly to example 1 with use of the same electrolyte at a constant 200 A current at room temperature in the course of 1 h. Instead of being driven by driver springs, the double rotation was effected here by means of toothed wheels and toothed rings.

3. Incorrectly coated plungers of piston valves which were coated with a DLC layer, a WC/C layer deposited on a Cr adhesive layer or CrN/DLC double layer were loaded onto satellite discs and trees as for a PVD coating process. Depending on the size of the control pistons, discs having different divisions were used. The trees were fastened in succession in a one-tree device on a coupling mounted in the bottom of a tank and, after positioning of driver springs, were immersed in the alkaline electrolyte of example 1. With constant double satellite rotation and constant 250 A current, the coatings were removed from the trees at room temperature in the course of 10 min.

4. In the device used in example 3, from CrN+DLC-coated bolts and piston pins loaded onto satellite trees the coatings were removed in the same electrolyte as in example 1 at constant 15 V in 5 min.

5. HSS drills and cutters and other HSS tools which were coated with different chromium-containing coating systems, such as Balinit Alcrona (aluminium chromium nitride), Balinit Helica (aluminium chromium silicon nitride), Balinit C (Cr+WC/C), Balinit DLC (Cr+DLC) and Balinit D (CrN) were loaded together onto satellite discs and installed analogously to example 3 on trees in the tank. After immersion of the tools in the alkaline electrolyte of example 1, the coatings were removed at room temperature with constant double rotation at a current of 250 A in the course of 30 min.

6. A similar mixture of differently coated tools was installed as in example 5 and then the coatings removed in one percent sodium hydroxide solution at a constant 12 V voltage under otherwise identical conditions in 25 min.

7. Two HSS hobs coated with Balinit Alcrona were loaded on to a tree and the latter was immersed in the electrolyte of example 6. With constant single rotation, the coatings were removed from them at a constant 12 V voltage in the course of 20 min.

8. A disc with drills and cutters which were coated with Balinit Futura-Nano (TiAlN) and Balinit Alcrona (AlCrN) were loaded on to a tree and inserted upside down into a device according to FIG. 1 and immersed in the electrolyte of example 1. With constant single rotation, the surface was modified by formation of a thin layer of an aluminium oxide with an oxonitride-containing transition zone to the TiAlN layer at a constant 6 V voltage in the course of 3 min.

9. Carbide tools which were coated with different coatings, such as Balinit Futura (titanium aluminium nitride), Balinit Xceed (TiAlN having a high aluminium content), Balinit AlCrona (AlCrN) and Balinit Helica (aluminium chromium silicon nitride) were loaded together onto satellite discs and immersed analogously to example 8 on trees in an electrolyte comprising ammonium nitrate and acetic acid with a pH of between 1.5 and 3. With constant single rotation, the coatings were removed from the tools at a voltage of 15 V in the course of 5 min.

10. Trees with coated bolts which, as a result of the process, were coated with a defective double layer consisting of CrN+ WC/C were removed directly from the PVD coating installation and the coatings removed in a device analogously to example 3 and under the same conditions as in example 3. Thereafter, the trees with the bolts were spray-cleaned several times in the tank and dried with warm air. The trees were then installed directly in the PVD coating installation for recoating.

In addition to being used for coating removal, the installation according to the invention can also be used for other electrochemical processes, for example for modifying coatings as in example 8 or for polishing or oxidizing surfaces of workpieces, defined rounding of edges on cutting tools, etc. Such processes, too, are made uniform through the rotation of the workpiece support. In addition, they can be better coordinated with other steps of a complex process.

LIST OF REFERENCE NUMERALS

1 Housing
2 Tank
3 Overflow
4 Opening
5 Holder
6 Baseplate
7 Coupling
8 Drive device
9 Current transmission device
10 Rods
11 Cross-strut
12 Opposite electrode
13 Heating and cooling device
14 Ultrasound Generator
15 Workpiece support
16 Shaft
17 Disc
18 Workpieces

The invention claimed is:
1. A coating removal installation comprising:
a tank for holding a liquid electrolyte and having an interior and an inner surface along the interior of the tank;
a workpiece support;
a removable holder comprising:
  a baseplate;
  a coupling for mounting the workpiece support, the coupling being supported by the baseplate so as to be rotatable about an axis of rotation, the axis of rotation passing through the interior of the tank, the workpiece support further comprising:
    a shaft connected to the coupling that lies in the axis of rotation and passes through the interior of the tank, and
    a plurality of shaft discs, each shaft disc having a center, the center of each shaft disc being fastened and axially centered on the shaft;
a current supply device having a first pole and a second pole;
a drive device operatively connected to the coupling for rotation of the coupling; and
an opposite electrode arranged in the interior of the tank at a distance away from the inner surface of the tank, the opposite electrode being connectable to the first pole of the current supply device and having an opposite elec- trode surface facing the axis of rotation such that all parts of the opposite electrode surface are approximately a same distance away from the axis of rotation, wherein the coupling is connectable to the second pole of the current supply device.

2. The coating removal installation according to claim 1, wherein the axis of rotation is a vertical axis.

3. The coating removal installation according to claim 1, wherein the coupling is arranged above the tank or in an upper part of the tank.

4. The coating removal installation according to claim 3, wherein the holder can be removed from the tank.

5. The coating removal installation according to claim 1, wherein the inner surface of the tank includes an electrically insulating material.

6. The coating removal installation according to claim 1, wherein an ultrasound generator is arranged in the interior of the tank.

7. The coating removal installation according to claim 1, wherein a heating and cooling device is arranged in the interior of the tank.

8. The coating removal installation according to claim 1, wherein the opposite electrode surface is concave and has an axis that coincides with the axis of rotation.

9. A method for operating a coating removal installation, wherein the coating removal installation comprises a removable holder that includes a baseplate and a coupling, the method comprising:
   connecting a workpiece support to the coupling, the coupling being supported by the baseplate so as to be rotatable about an axis of rotation, wherein the workpiece support includes an electrically conductive material on the coupling;
   arranging an opposite electrode in an interior of a tank at a distance away from an inner surface of the tank, the axis of rotation passing through the interior of the tank, the opposite electrode being connectable to a first pole of a current supply device and having an opposite electrode surface facing the axis of rotation such that all parts of the opposite electrode surface are approximately a same distance away from the axis of rotation;
   connecting a shaft to the coupling, the shaft lying in the axis of rotation and passing through the interior of the tank;
   fastening and axially centering a center of each of a plurality of shaft discs on the shaft;
   for coating removal, applying a first electrode potential at least intermittently by means of the current supply device to the coupling and to the workpiece support, the coupling and the workpiece support defining an electrode;
   applying a second electrode potential that is different from the first electrode potential at least intermittently to the opposite electrode surface;
   substantially completely immersing the workpiece support in a liquid electrolyte; and
   rotating the workpiece support by rotating the coupling using a drive device.

10. A method for operating a coating removal installation, wherein the coating removal installation comprises a removable holder that includes a baseplate and a coupling, the method comprising:
    removing a workpiece support that is loaded with a plurality of coated workpieces from a coating installation; and
    connecting the workpiece support to the coupling, the coupling being supported by the baseplate so as to be rotatable about an axis of rotation, wherein the plurality of coated workpieces are subjected to a coating removal process comprising:
       applying a first electrode potential at least intermittently using a current supply device to the coupling and to the workpiece support, the coupling and the workpiece support defining an electrode;
       applying a second electrode potential that is different from the first electrode potential at least intermittently to an opposite electrode surface of an opposite electrode;
       substantially completely immersing the workpiece support in a liquid electrolyte; and
       rotating the workpiece support about the axis of rotation, the axis of rotation passing through an interior of a tank by rotating the coupling using a drive device.

11. A method for operating a coating removal installation, wherein the coating removal installation comprises a removable holder that includes a baseplate and a coupling, the method comprising:
    connecting a workpiece support to the coupling, the coupling being supported by the baseplate so as to be rotatable about an axis of rotation, wherein the workpiece support is loaded with a plurality of workpieces and includes an electrically conductive material, and the plurality of coated workpieces are subjected to a coating removal process comprising:
       applying a first electrode potential at least intermittently by a current supply device to the coupling and to the workpiece support, the coupling and the workpiece support defining an electrode;
       applying a second electrode potential that is different from the first electrode potential at least intermittently to an opposite electrode surface of an opposite electrode, wherein the opposite electrode is arranged in an interior of a tank at a distance away from an inner surface of the tank, the axis of rotation passing through the interior of the tank, the opposite electrode being connectable to a first pole of the current supply device and having an opposite electrode surface facing the axis of rotation such that all parts of the opposite electrode surface are approximately a same distance away from the axis of rotation, and wherein the coupling is connectable to a second pole of the current supply device;
       substantially completely immersing the workpiece support in a liquid electrolyte; and
       rotating the workpiece support by rotating the coupling using a drive device;
    removing the workpiece support from the coating removal installation; and
    inserting the workpiece support into a coating installation for recoating the plurality of workpieces that were subjected to the coating removal process.

12. A method for operating a coating removal installation according to claim 11, wherein the workpiece support, loaded with the workpieces, is washed, sprayed, or dried, between the coating removal and the recoating.

13. A coating removal installation comprising:
    a tank for holding a liquid electrolyte and having an interior and an inner surface along the interior of the tank;
    a workpiece support;
    a removable holder comprising:
       a baseplate;
       a coupling for mounting the workpiece support, the coupling being supported by the baseplate so as to be rotatable about an axis of rotation, the axis of rotation passing through the interior of the tank, the workpiece support comprising:
  a shaft connected to the coupling that lies in the axis of rotation and passes through the interior of the tank, and
  a plurality of shaft discs, each shaft disc having a center, the center of each shaft disc being fastened and axially centered on the shaft;
a current supply device having a first pole and a second pole;
a drive device operatively connected to the coupling for rotation of the coupling; and
an opposite electrode arranged in the interior of the tank at a distance away from the inner surface of the tank, the opposite electrode being connectable to the first pole of the current supply device and having an opposite electrode surface facing the axis of rotation such that all parts of the opposite electrode surface are approximately a same distance away from the axis of rotation, wherein the coupling is connectable to the second pole of the current supply device.

* * * * *